(12) United States Patent
Nakamura (10) Patent No.: US 10,079,258 B2
(45) Date of Patent: Sep. 18, 2018

(54) OPTICAL DETECTOR AND IMAGING APPARATUS (71) Applicant: FUJITSU LIMITED, Kawasaki-shi, Kanagawa (JP)

(72) Inventor: Makoto Nakamura, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/825,704

(22) Filed: Nov. 29, 2017

(65) Prior Publication Data

US 2018/0182799 A1    Jun. 28, 2018

(30) Foreign Application Priority Data

Dec. 27, 2016 (JP) .................. 2016-253197

(51) Int. Cl.
H01L 27/146 (2006.01)
H01L 31/0232 (2014.01)
H01L 31/0304 (2006.01)
H01L 31/0236 (2006.01)

(52) U.S. Cl.
CPC .... *H01L 27/14625* (2013.01); *H01L 27/1464* (2013.01); *H01L 27/1465* (2013.01); *H01L 31/02327* (2013.01); *H01L 31/02363* (2013.01); *H01L 31/0304* (2013.01)

(58) Field of Classification Search
CPC ........... H01L 27/14625; H01L 27/1465; H01L 27/1464
See application file for complete search history.

(56) References Cited

U.S. PATENT DOCUMENTS 6,790,502 B1 * 9/2004 Yamamoto ............. B82Y 20/00
                                                   374/E11.001
2010/0276573 A1 * 11/2010 Duerksen ............. G01J 1/4257
                                                   250/208.6

FOREIGN PATENT DOCUMENTS

JP   H06-163968 A   6/1994
JP   2008-066584 A  3/2008
JP   2013-065908 A  4/2013

OTHER PUBLICATIONS

D. S. Hobbs, et al.; "Design, Fabrication, and Measured Performance of Anti-reflecting Surface Textures in Infrared Transmitting Materials", Visual Communications and Image Processing; Jan. 20, 2004-Jan. 20, 2004; vol. 5786, No. 1, Mar. 28, 2005, pp. 349-364, XP002442432, cited in ESSR for EP Patent Application No. 17204194.9 (16 Sheets).
N. Kadakia, et al.; "Fabrication of surface textures by ion implantation for antireflection of silicon crystals", Applied Physics Letters, vol. 97, No. 19, Nov. 12, 2010, pp. 191912-191912, XP012137593, cited in ESSR for EP Patent Application No. 17204194.9 (3 Sheets).

(Continued)

*Primary Examiner* — Douglas Menz
(74) *Attorney, Agent, or Firm* — Kratz, Quintos & Hanson, LLC (57) ABSTRACT An optical detector includes a sensor device chip including a substrate and a sensor device that is provided at a front face side of the substrate and detects light entering from a back face side of the substrate. The sensor device chip has, at the back face side of the substrate, a region in which a refractive index varies so as to increase from a light incident face toward a thicknesswise direction.

12 Claims, 9 Drawing Sheets (56) References Cited

OTHER PUBLICATIONS

A. K. Sood, et al.; "Design and Development of High Performance Radiation Hardened Anti-Reflection Coatings for LWIR HgCdTe Focal Plane Arrays", Infrared Detector Materials and Devices, vol. 5564, 2004, pp. 15-26, XP040191379, cited in ESSR for EP Patent Application No. 17204194.9 (12 Sheets).

M. F. Schubert, et al.; "Design of multilayer antireflection coatings made from co-sputtered and low-refractive-index materials by genetic algorithm", Optics Express, vol. 16, No. 8, Apr. 14, 2008, pp. 5290-5298, XP055474378, cited in ESSR for EP Patent Application No. 17204194.9 (9 Sheets).

Extended European Search Report for counterpart EP Patent Application No. 17204194.9 dated May 22, 2018 (9 Sheets).

* cited by examiner

OPTICAL DETECTOR AND IMAGING APPARATUS

CROSS-REFERENCE TO RELATED APPLICATION

This application is based upon and claims the benefit of priority of the prior Japanese Patent Application No. 2016-253197, filed on Dec. 27, 2016, the entire contents of which are incorporated herein by reference.

FIELD

The embodiments discussed herein are related to an optical detector and an imaging apparatus.

BACKGROUND

Conventionally, an optical detector that detects light entering from the back face side of a substrate is available.

In such an optical detector as just described, by providing irregularities or a rough surface, incident light is scattered such that a greater amount of light is absorbed to reduce the loss of the light.

SUMMARY

According to an aspect of the embodiments, an optical detector includes a sensor device chip including a substrate and a sensor device that is provided at a front face side of the substrate and detects light entering from a back face side of the substrate, wherein the sensor device chip has, at the back face side of the substrate, a region in which a refractive index varies so as to increase from a light incident face toward a thicknesswise direction.

According to another aspect of the embodiments, an imaging apparatus includes an optical detector, and a control arithmetic unit coupled to the optical detector, wherein the optical detection includes a sensor device chip including a substrate and a sensor device that is provided at a front face side of the substrate and detects light entering from a back face side of the substrate, and wherein the sensor device chip has, at the back face side of the substrate, a region in which a refractive index varies so as to increase from a light incident face toward a thicknesswise direction.

The object and advantages of the invention will be realized and attained by means of the elements and combinations particularly pointed out in the claims. It is to be understood that both the foregoing general description and the following detailed description are exemplary and explanatory and are not restrictive of the invention.

Incidentally, in order to implement increase of the sensitivity of an optical detector that detects light entering from the back face side of a substrate, it is important to reduce reflection of light in a region including a light incident face at the back face side of the substrate.

It is an object in one aspect of the embodiment to reduce the reflection of light in a region including a light incident face at the back face side of a substrate and implement increase in sensitivity.

DESCRIPTION OF EMBODIMENTS

In the following, an optical detector and an imaging apparatus according to an embodiment of the present technology are described with reference to the drawings.

Figure 1:
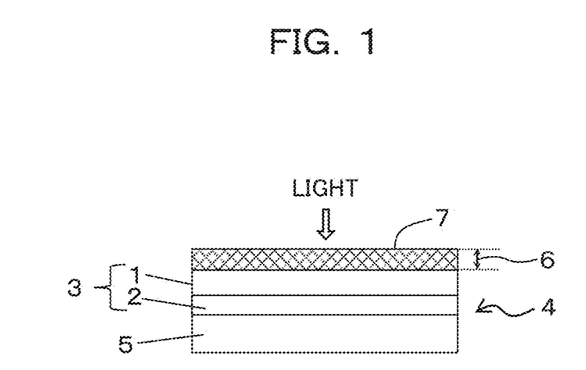
FIG. 1 is a schematic sectional view depicting a configuration of an optical detector according to the present embodiment.

As depicted in FIG. 1, the optical detector according to the present embodiment includes a sensor device chip 3 including a substrate 1 and a sensor device 2 that is provided at a front face side of the substrate 1 and detects light entering from the back face side of the substrate 1.

It is to be noted that the optical detector 4 is also called back incidence type optical detector. Further, in FIG. 1, reference numeral 5 denotes a signal processing device joined to the sensor device chip 3.

The sensor device chip 3 has, at the back face side of the substrate 1, a region 6 in which the refractive index varies so as to increase from a light incident face (light reception face) 7 toward the thicknesswise direction. Here, the region 6 in which the refractive index varies is a region in which the refractive index varies gradually. It is to be noted that the back face of the substrate 1 is the back face of the sensor device chip 3.

Consequently, reflection of light in the region including the light incident face 7 at the back face side of the substrate 1 can be reduced. Therefore, the region 6 in which the refractive index varies functions as a reflection reduction region in which reflection is reduced.

Figure 2:
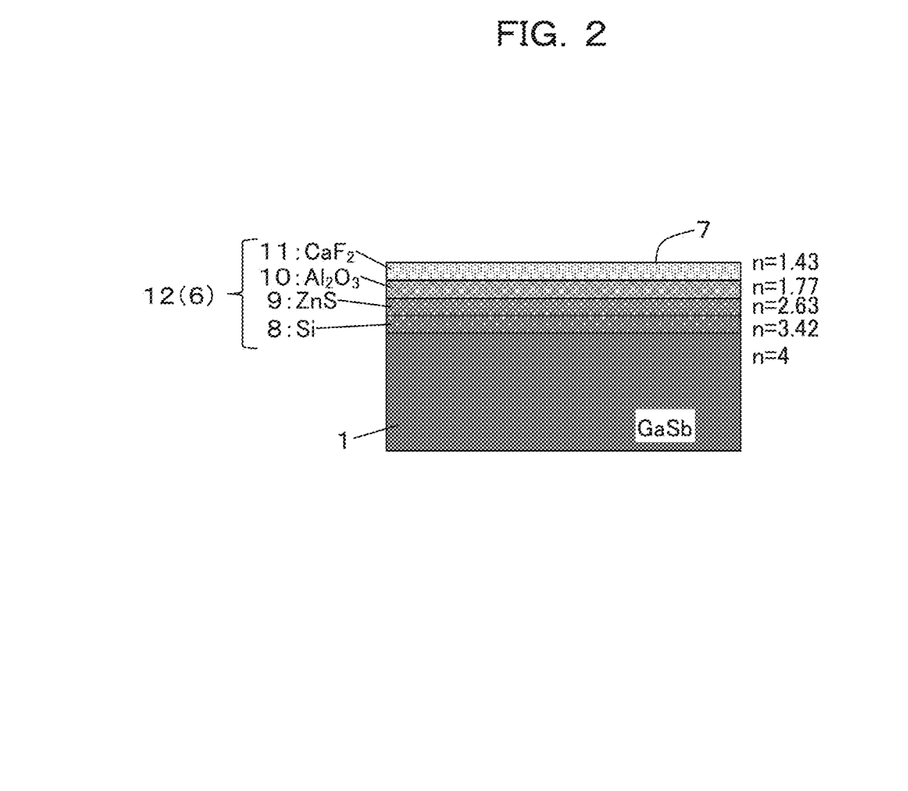
FIG. 2 is a schematic sectional view depicting an example of a configuration of a region that is provided in the optical detector according to the present embodiment and in which the refractive index varies.
Figure 3:
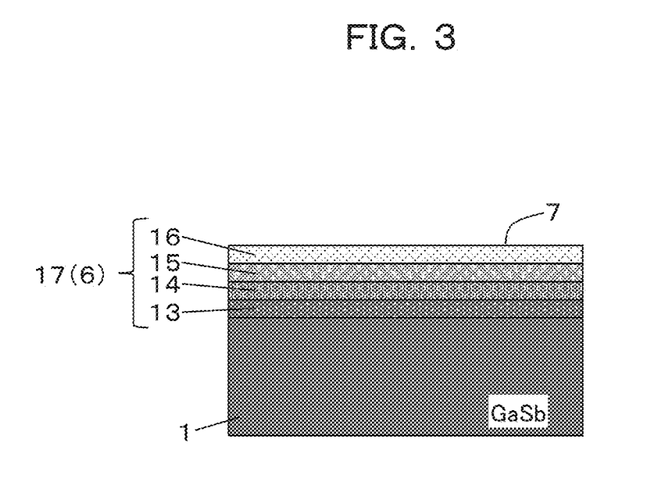
FIG. 3 is a schematic sectional view depicting another example of a configuration of a region that is provided in the optical detector according to the present embodiment and in which the refractive index varies.

Here, for example, as depicted in FIGS. 2 and 3, the region 6 in which the refractive index varies may be configured from a stacked film 12 (17) provided on the back face of the substrate 1 and formed from a plurality of films 8 to 11 (13 to 16) having refractive indexes different from each other.

In this case, the stacked film 12 (17) may be provided on the back face of the substrate 1 by stacking the plurality of films 8 to 11 (13 to 16) formed from materials having refractive indexes different from each other such that the refractive index decreases gradually. In this case, the refractive index increases gradually from the light incident face 7 toward the thicknesswise direction.

For example, as depicted in FIG. 2, a Si film 8 having a refractive index n=3.42, a ZnS film 9 having a refractive index n=2.63, an Al$_2$O$_3$ film 10 having a refractive index n=1.77 and a CaF$_2$ film 11 having a refractive index n=1.43 are stacked in order from the substrate 1 side on the back face of the GaSb substrate 1 having a refractive index n=4 so as to provide the stacked film 12 on the back face of the substrate 1.

Reflection of light can be reduced by gradually varying the refractive index such that the refractive index decreases gradually from the refractive index of the substrate 1 (in the example described above, the refractive index n=4) to the refractive index of the air (refractive index n=1) in the region including the light incident face 7 at the back face side of the substrate 1 in this manner.

In particular, since variation of the refractive index contributes principally to reflection of light, the reflection of light can be reduced by suppressing sudden variation of the refractive index from the refractive index of the air (refractive index n=1) to the refractive index of the substrate 1 (in the example described above, the refractive index n=4) in the region including the light incident face 7 at the back face side of the substrate 1.

Further, for example, as depicted in FIG. 3, a plurality of GaSb films 13 to 16 may be formed by sputtering using masks, which have meshes that indicate gradual increase in roughness thereamong, on the back face of the GaSb substrate 1 such that the plurality of GaSb films 13 to 16 are stacked in order from the substrate 1 side in such a manner that the density gradually decreases, namely, the refractive index gradually decreases, thereby to provide a stacked film 17 on the back face of the GaSb substrate 1. In this case, the refractive index (density) gradually increases from the light incident face 7 toward the thicknesswise direction. Further, the plurality of GaSb films 13 to 16 have holes having sizes different from each other.

In this manner, reflection of light can be reduced by setting the density so as to gradually decrease toward the light incident face 7 in the region including the light incident face 7 at the back face side of the substrate 1 and varying the refractive index moderately such that the refractive index gradually decreases from the refractive index of the substrate 1 (in the example described above, the refractive index n=4) to the refractive index of the air (refractive index n=1).

Further, it is preferable for the stacked film 12 (17) to have irregularities at a boundary region between adjacent ones of the plurality of films 8 to 11 (13 to 16). Consequently, moderate variation of the refractive index in the boundary region (interface) between the plurality of films 8 to 11 (13 to 16) can be implemented and reflection of light on the interface can be suppressed.

For example, by providing irregularities on the back face of the substrate 1, the stacked film 12 (17) stacked on the back face of the substrate 1 has irregularities in the boundary region between the plurality of films 8 to 11 (13 to 16). Further, since the irregularities are provided intentionally, it is preferable to set the height (depth) of the irregularities to approximately 10 nm or more (for example, several 10 nm) taking the difficulty of production of the irregularities into consideration.

Figure 4:
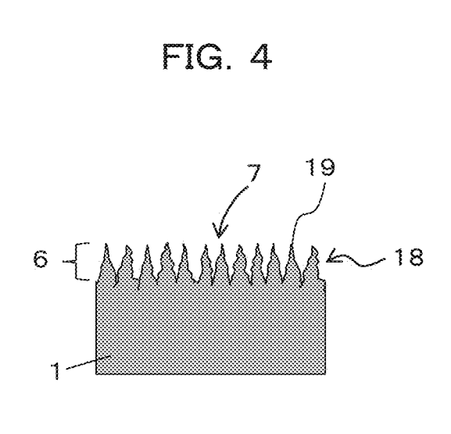
FIG. 4 is a schematic sectional view depicting a further example of a configuration of a region that is provided in the optical detector according to the present embodiment and in which the refractive index varies.

Incidentally, the region 6 in which the refractive index varies may be provided as a region at the back face side of the substrate 1 and in a porous structure 18 as depicted in FIG. 4. In this case, the region 6 in which the refractive index varies is a porous region having a porous property.

In particular, the region 6 in which the refractive index varies may be configured by configuring the region including the light incident face 7 at the back face side of the substrate 1 in the porous structure 18 such that the density (refractive index) of the porous structure 18 gradually varies from the light incident face 7 toward the thicknesswise direction (inside).

In this case, the region 6 in which the refractive index varies is a region in which the density varies and is configured from the porous structure 18 in which the density (refractive index) gradually varies.

The porous structure 18 in which the density (refractive index) gradually increases from the light incident face 7 toward the thicknesswise direction (inside) may be provided in the region including the light incident face 7 at the back face side of the substrate 1. In this case, in the porous structure 18, the density (refractive index) gradually decreases from the front face, namely, from the inside, toward the light incident face 7.

By providing such a porous structure 18 as described above such that the density gradually decreases from the inside toward the light incident face 7 in the region including the light incident face 7 at the back face side of the substrate 1 and the refractive index moderately varies such that the refractive index gradually decreases from the refractive index of the substrate 1 to the refractive index of the air, reflection of light can be reduced.

For example, by performing ion implantation of Sn (Sn$^+$) into the region at the back face side of the GaSb substrate 1, such a porous structure 18 as described above can be provided in the region including the light incident face 7 at the back face side of the substrate 1. In particular, by performing ion implantation of Sn (Sn$^+$) into the region at the back face side of the GaSb substrate 1, self-organizing formation of such a porous structure 18 as described above is implemented in the region including the light incident face 7 at the back face side of the substrate 1.

In particular, for example, by performing ion implantation of Sn$^+$ into the region at the back face side of the GaSb substrate 1 by 60 keV and 8.9×10$^{14}$ ions/cm$^2$, self-organizing formation of such a porous structure 18 as described above is implemented.

It is to be noted that, for example, also by performing ion implantation of Ga$^+$ into the region at the back face side of the GaSb substrate 1 by 30 keV and 1×10$^{14}$ ions/cm$^2$, self-organizing formation of such a porous structure 18 as described above is implemented.

Where such a porous structure 18 as described above is provided by ion implantation in such a manner as described above, it is preferable to set the ion implantation amount, for example, to approximately 4×10$^{14}$ ions/cm$^2$ to 1.5×10$^{15}$ ions/cm$^2$. Consequently, the reflection suppression effect can be enhanced.

It is to be noted that the substrate 1 is not limited to this, and, for example, a GaSb substrate, an InSb substrate, a Ge substrate, a Si substrate or an InP substrate can be used for the substrate 1. Further, an element (implantation ion) upon ion implantation is not limited to this, and an element such as, for example, Ga (Ga$^+$), Sn (Sn$^+$), N (H$^+$, N$_2^+$), Ar, Xe, Kr or Ne can be used.

Where the porous structure 18 is provided in the region including the light incident face 7 at the back face side of the substrate 1 in such a manner as described above, the region 6 in which the refractive index varies is a region at the back face side of the substrate 1 and has a self-organizing structure by the ion implantation.

Further, the region 6 in which the refractive index varies is a region at the back face side of the substrate 1 and has a composition different from that of the other region of the substrate 1. In particular, where the porous structure 18 is provided by ion implantation into the region at the back face side of the substrate 1, the ion-implanted element remains in the region in which the ion implantation is performed, namely, in the region 6 in which the refractive index varies. Therefore, the region 6 in which the refractive index varies has a composition different from that of the other region of the substrate 1.

Further, the region 6 in which the refractive index varies is a region at the back face side of the substrate 1 and is a region in which a greater amount of Ga than that of the different region of the substrate 1 is contained or one of elements such as Sn, N, Ar, Xe, Kr and Ne is contained.

Incidentally, as depicted in FIG. 4, the porous structure 18 configured in such a manner as described above has fine holes extending in the thicknesswise direction of the substrate 1.

In this case, the region 6 in which the refractive index varies is a region at the back face side of the substrate 1 and has projections 19 having a column shape, a wall shape, a conical shape ora pyramidal shape. Further, the projections 19 are disposed at random (random structure).

It is to be noted that also it can be considered that the fine holes configuring the porous structure 18 have a column shape, a wall shape or the like. Also it can be considered that the fine holes have a random structure. Further, the height of the projections and the depth of the holes may be same as each other or different from each other.

Figure 5A:
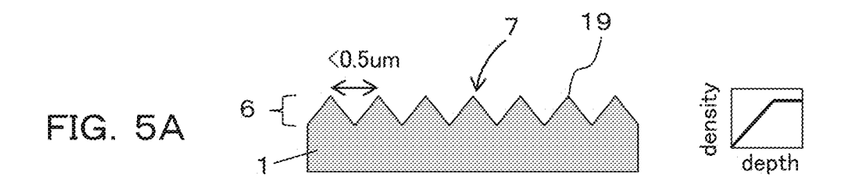
FIGS. 5A to 5C are schematic sectional views depicting an example of the configuration of a region that is provided in the optical detector according to the present embodiment and in which the refractive index varies and a comparative example.
Figure 5B:
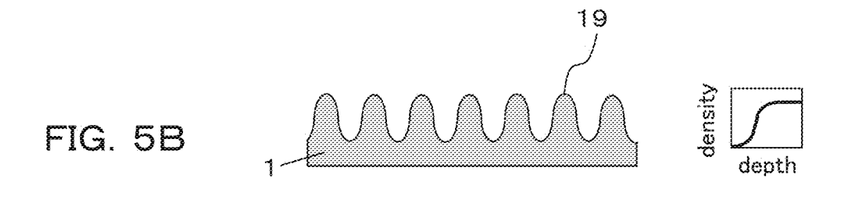

In this manner, where the region 6 in which the refractive index varies is the region at the back face side of the substrate 1 and has the projections 19 having a column shape, a wall shape, a conical shape or a pyramidal shape, in order to reduce reflection of light, it is ideal that the projections 19 have such shapes as depicted, for example, in FIGS. 5A and 5B and the density (refractive index) gradually increases toward the thicknesswise direction (depthwise direction) of the substrate 1.

Further, it is preferable to set the distance between the holes configuring the porous structure 18 or the projections 19 to one half or less of the wavelength of light to be detected.

For example, where the sensor device 2 is configured to detect light in an infrared region of a wavelength of approximately 0.7 µm to 15 µm, it is preferable to set the distance between the holes configuring the porous structure 18 or the projections 19 to one half or less of a wavelength included in the wavelength region. For example, it is preferable to set the distance between (cycle of) the holes configuring the porous structure 18 or the projections 19 to a distance (cycle) less than approximately 0.5 µm. In other words, it is preferable to set the distance between (cycle of) the holes configuring the porous structure 18 or the projections 19 to a submicron cycle shorter than the signal wavelength.

It is to be noted that, although the holes configuring the porous structure 18 or the projections 15 are not limited particularly in depth or height, if, for example, attenuation and so forth are taken into consideration, then it is preferable to set the depth or the height to less than approximately 1 µm. Further, it is preferable to provide no top face to the projections 19 and provide no bottom face to the holes, namely, it is preferable to provide no flat portion in a region to which light is incident, and even if a flat portion exists, it is preferable to set the portion to a smaller size than approximately 0.5 µm.

Here, the density (refractive index) gradually varies over the overall substrate 1 in the thicknesswise direction and the top face of the projections 19 and the bottom face of the holes are not flat. Thus, since there is no flat location in the region to which the light is incident (refer to FIGS. 4, 5A and 5B), a low reflectance can be implemented by a moth-eye effect. For example, it is possible to reduce the reflectance so as to be lower than approximately 5%, and the sensitivity of the sensor can be enhanced significantly.

Figure 5C:
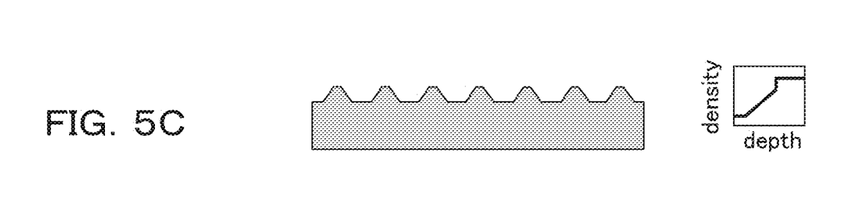

In contrast, if the top face of the projections or the bottom face of the holes is flat and there is a flat location in the region to which light is incident (refer to FIG. 5C), then it is difficult to sufficiently reduce the reflection.

Figure 6A:
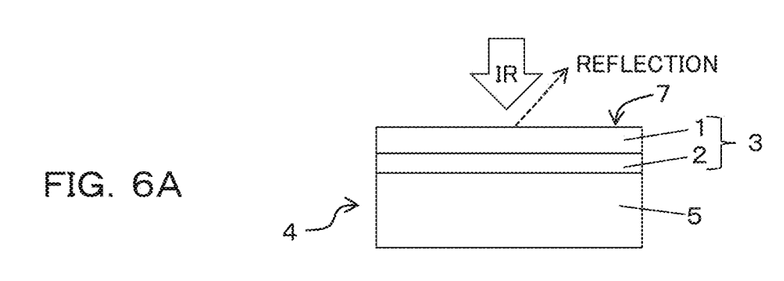
FIGS. 6A and 6B are schematic sectional views illustrating a subject of the present technology.
Figure 6B:
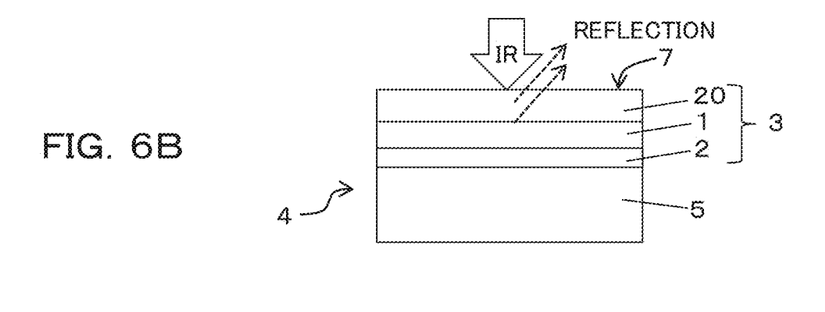

It is to be noted that, in order to achieve enhancement of the sensitivity of the optical detector 4, it seems recommendable to reduce the thickness of the substrate 1 to suppress absorption in the substrate 1 (for example, refer to FIG. 6A). However, since, for example, approximately 20% of light is reflected by the light incident face 7, the efficiency is low and it is insufficient in order to achieve enhancement of the sensitivity. Further, in order to implement substrate thickness reduction control, it seems recommendable to provide an etching stop layer 20 in the substrate 1 and reduce the thickness of the substrate 1 by etching (for example, refer to FIG. 6B). However, since light is reflected also by the interface between the etching stop layer 20 and the substrate 1, light that reaches the sensor device is, for example, approximately 64% and this is insufficient in order to implement enhancement of the sensitivity.

On the other hand, by providing the region 6 in which the refractive index varies as described above, especially, by providing the porous structure 18 in the region 6, the reflectance can be reduced so as to be lower than approximately 5% and light that reaches the sensor device 2 increases, for example, to approximately 95%. Therefore, in comparison with an alternative case in which the etching stop layer 20 is provided (for example, refer to FIG. 6B), the sensitivity of the sensor can be improved to approximately 1.5 times and improvement of the sensitivity can be implemented. It is to be noted that, by adopting such a configuration as described above, the etching stop layer 20 may not be provided.

Incidentally, the optical detector 4 configured in such a manner as described above can be applied, for example, to an infrared detector (infrared sensor) or a solar cell.

For example, where the optical detector 4 is applied to an infrared detector, the sensor device 2 may be configured as an infrared sensor device (IR sensor) that detects light, for example, in the infrared region of a wavelength of approximately 0.7 µm to approximately 15 µm. In this case, the sensor device 2 is provided, at the front face side of the substrate 1, as a device having, for example, a superlattice structure, a quantum well structure, a quantum dot structure or the like. It is to be noted that the sensor device 2 is also called sensor device array.

Figure 7A:
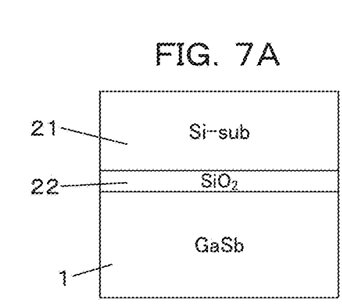
FIGS. 7A to 7H are schematic sectional views illustrating an example of a fabrication method of the optical detector according to the present embodiment.
Figure 7B:
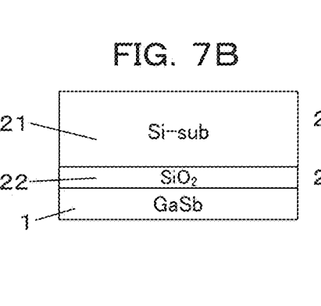
Figure 7C:
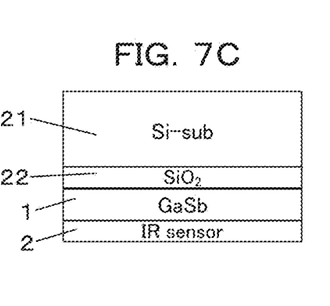
Figure 7D:
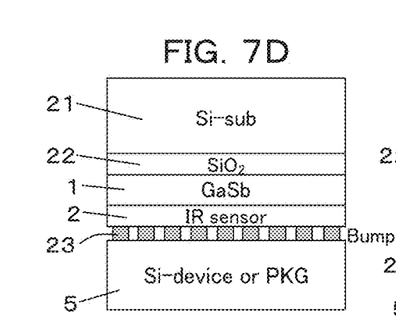
Figure 7E:
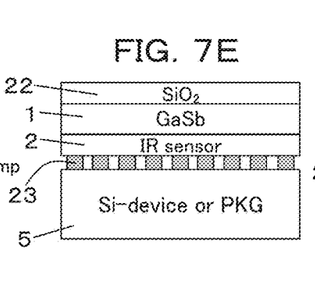
Figure 7F:
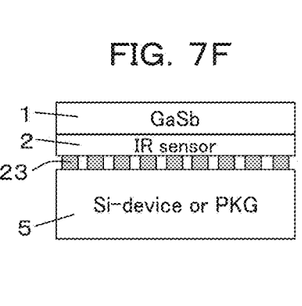
Figure 7G:
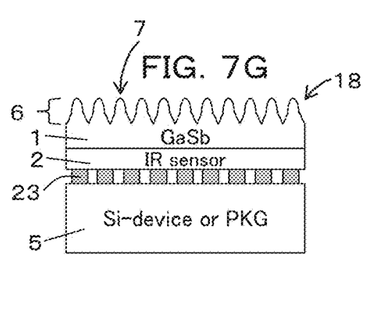
Figure 7H:
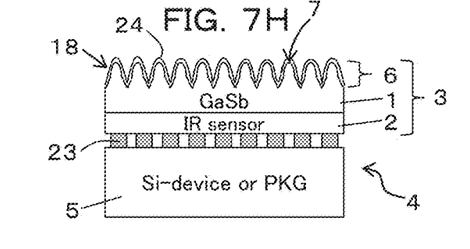
Figure 8A:
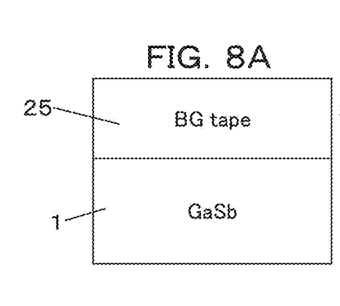
FIGS. 8A to 8I are schematic sectional views illustrating a different example of the fabrication method of the optical detector according to the present embodiment.
Figure 8B:
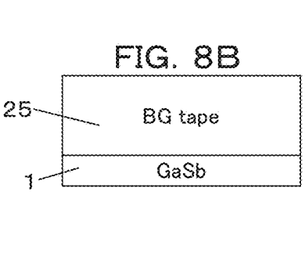
Figure 8C:
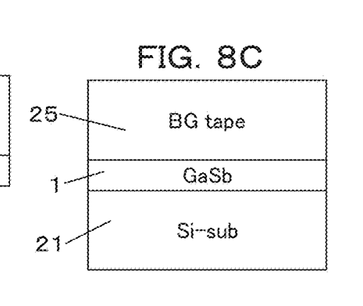
Figure 8D:
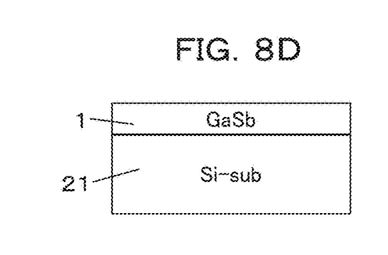
Figure 8E:
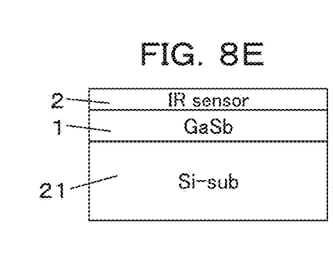
Figure 8F:
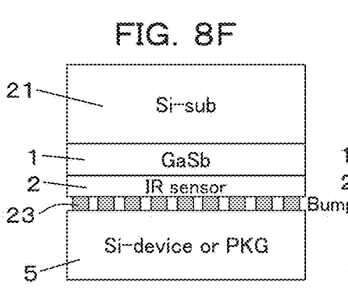
Figure 8G:
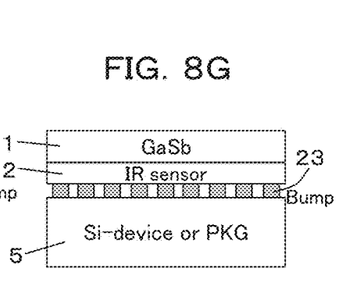
Figure 8H:
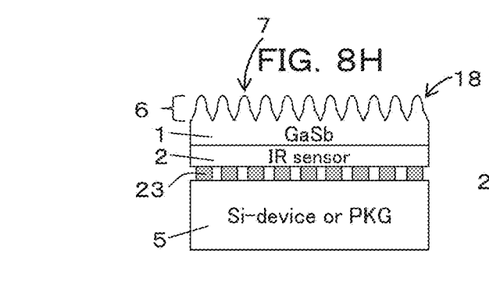
Figure 8I:
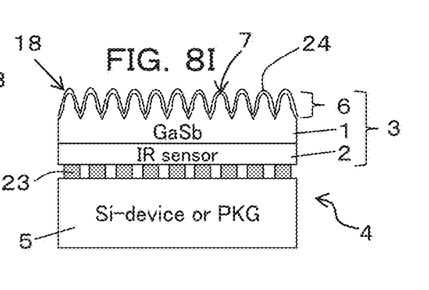

The signal processing device 5 having an electronic circuit formed, for example, on the surface of a silicon substrate is joined to the sensor device 2 provided at the front face side of the substrate 1 as described through a joining portion such as, for example, bumps 23 (for example, refer to FIGS. 1, 7H and 8I). It is to be noted that the signal processing device 5 is also called signal processing package or signal processing circuit chip.

Now, a fabrication method for the optical detector 4 according to the present embodiment is described with reference to FIGS. 7A to 7H and 8A to 8I.

Here, description is given taking a case in which an infrared sensor device (backside illumination type infrared sensor device) 2 is provided on a GaSb substrate 1 to produce an infrared sensor chip 3 and a signal processing device 5 is joined to the infrared sensor device chip 3 through bumps 23 to fabricate an infrared detector 4 as an example.

First, description is given with reference to FIGS. 7A to 7H taking a case in which an infrared sensor device 2 is produced on a face reduced in thickness (thin face) of the substrate 1 as an example.

First, as depicted in FIG. 7A, a support substrate 21 is attached to the back face side of a GaSb substrate 1, which is the back face of an infrared sensor device chip 3.

For example, a $SiO_2$ film 22 (for example, approximately 100 nm thick) is deposited on the back face of the GaSb substrate 1, for example, by a PE-CVD (plasma-enhanced chemicalvapor deposition) method, and a silicon substrate (Si-sub) is joined as the support substrate 21 to the GaSb substrate 1 at a room (ordinary) temperature through the $SiO_2$ film 22.

Then, the GaSb substrate 1 is thinned as depicted in FIG. 7B.

For example, the GaSb substrate 1 on which the infrared sensor device 2 is to be provided is thinned at the front face side thereof to approximately 10 μm from the front face, for example, by back grind and chemical mechanical polishing (CMP), and then chemical cleaning (etch) is performed.

Then, an infrared sensor device (IR sensor) 2 is formed on the thinned face as depicted in FIG. 7C.

For example, the infrared sensor device 2 including a superlattice structure or the like is formed by an MBE (Molecular Beam Epitaxy) method.

Then, as depicted in FIG. 7D, a signal processing device 5 is joined after dicing the wafer into individual chips.

For example, after dicing the wafer into individual chips, a signal processing device (Si-device or PKG) 5 including an electronic circuit formed on the front face of a silicon substrate is stacked and is joined through In bumps 23, whereafter underfill is injected into gaps between the In bumps 23 (not depicted).

Then, as depicted in FIG. 7E, the silicon substrate as the support substrate 21 is removed.

For example, the silicon substrate as the support substrate 21 is removed by grinding while leaving a thickness of, for example, approximately 10 μm and a natural oxidation film is removed, whereafter the silicon substrate is soaked in TMAH (tetramethylammonium hydroxide; for example, approximately 70° C.) thereby to remove the silicon substrate 21.

It is to be noted that the signal processing device 5 may be protected by forming a $SiO_2$ film (for example, approximately 1 μm) on the overall area (overall face) after the bump joining.

Thereafter, the $SiO_2$ film 22 is removed as depicted in FIG. 7F.

For example, the signal processing device 5 is soaked in d-HF (ratio of 1% of hydrofluoric acid to water) to remove the $SiO_2$ film 22 on the joining face between the GaSb substrate 1 and the silicon substrate as the support substrate 21.

Then, ion implantation is performed for a region at the back face side of the GaSb substrate 1 as depicted in FIG. 7G to forma porous structure 18 in which the density varies from the front face side to the inside. Consequently, the region in which the density varies, namely, the region 6 in which the refractive index varies, is formed in the region at the back face side of the GaSb substrate 1. The region 6 in which the refractive index varies (region in which the density varies) functions as a reflection suppression region.

For example, by performing ion implantation of Ga ($Ga^+$) for the region at the back face side of the GaSb substrate 1 by 60 keV, $1 \times 10^{12} 2^5$ ions/$cm^2$ and 150K, the porous structure 18 in which the density (refractive index) gradually increases from the light incident face 7 toward the thicknesswise direction (toward the inside) is formed in the region 6 including the light incident face 7 at the back face side of the substrate 1 by self-organizing formation.

Then, since the surface at the back face side of the GaSb substrate 1 on which such a porous structure 18 as described above is formed is unstable as depicted in FIG. 7H, a protective film 24 is formed so as to cover the surface at the back face side of the GaSb substrate 1 on which such a porous structure 18 as described above is formed.

For example, a $SiO_2$ film having a thickness of, for example, approximately 10 nm is formed as the protective film 24 by the ALD (Atomic Layer Deposition) method.

In this manner, the infrared detector 4 that includes the infrared sensor device chip 3 on which the infrared sensor device 2 is produced on the face (thinned face) formed by thinning the substrate 1 can be fabricated.

It is to be noted here that, although the porous structure 18 is formed after the support substrate 21 is removed, formation of the porous structure 18 is not limited to this and the porous structure 18 may be formed before the support substrate 21 is attached.

Now, an example in which a porous structure 18 as a reflection suppression structure is produced on a face (thinned face) formed by thinning the substrate 1 is described with reference to FIGS. 8A to 8I.

First, as depicted in FIG. 8A, a BG (back grind) tape 25 is attached and temporarily fixed to the front face side (device production face) of a GaSb substrate 1 on which an infrared sensor device 2 is to be provided.

Then, as depicted in FIG. 8B, the GaSb substrate 1 is thinned.

For example, the GaSb substrate 1 is thinned at the back face side thereof that serves as the back face of the infrared sensor device chip 3 from the front face thereof, for example, to approximately 10 μm by back grind and CMP, whereafter liquid cleaning (etch) is performed.

Then, as depicted in FIG. 8C, a support substrate 21 is attached to the thinned face.

For example, a silicon substrate (Si-sub; or glass substrate) as the support substrate 21 is joined (room temperature bonding) to the thinned face at the back face side of the GaSb substrate 1 that serves as the back face of the infrared sensor device chip 3.

Then, as depicted in FIG. 8D, the BG tape 25 is removed.

Then, as depicted in FIG. 8E, an infrared sensor device (IR sensor) 2 is formed at the front face side of the GaSb substrate 1.

For example, the infrared sensor device 2 including a superlattice structure or the like is formed by the MBE method.

Then, as depicted in FIG. 8F, a signal processing device 5 is joined after dicing the wafer into individual chips.

For example, after dicing the wafer into individual chips, a signal processing device (Si-device or PKG) 5 including an electronic circuit formed on the front face of a silicon substrate is stacked and then is joined through In bumps 23, whereafter underfill is injected into gaps between the In bumps 23 (not depicted).

Thereafter, as depicted in FIG. 8G, the silicon substrate (or the glass substrate) as the support substrate 21 is removed. For example, the support substrate 21 may be removed by back grind and etching using chemical liquid.

Then, as depicted in FIG. 8H, ion implantation for the region at the back face side of the GaSb substrate 1 is performed to form a porous structure 18 in which the density varies from the front face side to the inside. Consequently, a region in which the density varies, namely, the region 6 in which the refractive index varies, is formed in the region at the back face side of the substrate 1. The region 6 in which the refractive index varies (region in which the density varies) functions as the reflection suppression region.

For example, by performing ion implantation of Ga ($Ga^+$) for the region at the back face side of the GaSb substrate 1 by 60 keV, $1\times10^{12}5$ ions/$cm^2$ and 150K, the porous structure 18 in which the density (refractive index) gradually increases from the light incident face 7 toward the thicknesswise direction (toward the inside) is formed in the region including the light incident face 7 at the back face side of the GaSb substrate 1 by self-organizing formation.

Then, since the surface at the back face side of the GaSb substrate 1 on which such a porous structure 18 as described above is formed is unstable as depicted in FIG. 8I, a protective film 24 is formed so as to cover the surface at the back face side of the GaSb substrate 1 on which such a porous structure 18 as described above is formed.

For example, a $SiO_2$ film having a thickness of, for example, approximately 10 nm is formed as the protective film 24 by the ALD method.

The infrared detector 4 including the infrared sensor device chip 3 on which the porous structure 18 as a reflection suppression structure is produced on the face (thinned face) formed by thinning the substrate 1 can be fabricated.

It is to be noted here that, while the porous structure 18 is formed after the support substrate 21 is removed, the formation of the porous structure 18 is not limited to this and the porous structure 18 may be formed after the GaSb substrate 1 is thinned before the support substrate 21 is attached.

It is to be noted that the formation method of the porous structure 18 is not limited to that described above.

For example, the region 6 in which the refractive index varies may be provided in the region at the back face side of the substrate 1 by controlling the density variation, for example, by wet etching or dry etching after the region at the back face side of the substrate is configured as a porous region by anodization. In this case, the region 6 in which the refractive index varies may be provided, for example, by adjusting the etching time to control the diameter or the depth of the porous region so as to gradually vary the density (refractive index) of the porous region from the light incident face toward the thicknesswise direction.

Further, the region 6 in which the refractive index varies may be provided by forming a thin film (for example, of silicon or the like) at the back face side of the substrate first, converting the thin film into a porous film by anodization and then performing dry etching such as, for example, RIE using the porous film as a mask to form a porous region, in which the density variation is controlled, in the region at the back face side of the substrate 1. In this case, the region 6 in which the refractive index varies may be provided, for example, by adjusting the etching time or the like to control the diameter or the depth of the porous region so as to gradually vary the density (refractive index) of the porous region from the light incident face toward the thicknesswise direction.

It is to be noted here that, while the porous film is used as a mask, the method is not limited to this, and the region 6 in which the refractive index varies may be provided by performing dry etching or wet etching using a mask to form a porous region, in which the density variation is controlled, in the region at the back face side of the substrate 1.

Incidentally, an imaging apparatus can be configured as an apparatus that includes the optical detector 4 configured in such a manner as described above.

For example, where the optical detector 4 configured in such a manner as described above is applied to an infrared detector and an imaging apparatus is configured as an apparatus including the infrared detector, the imaging apparatus (infrared imaging apparatus) may be configured in the following manner.

Figure 9:
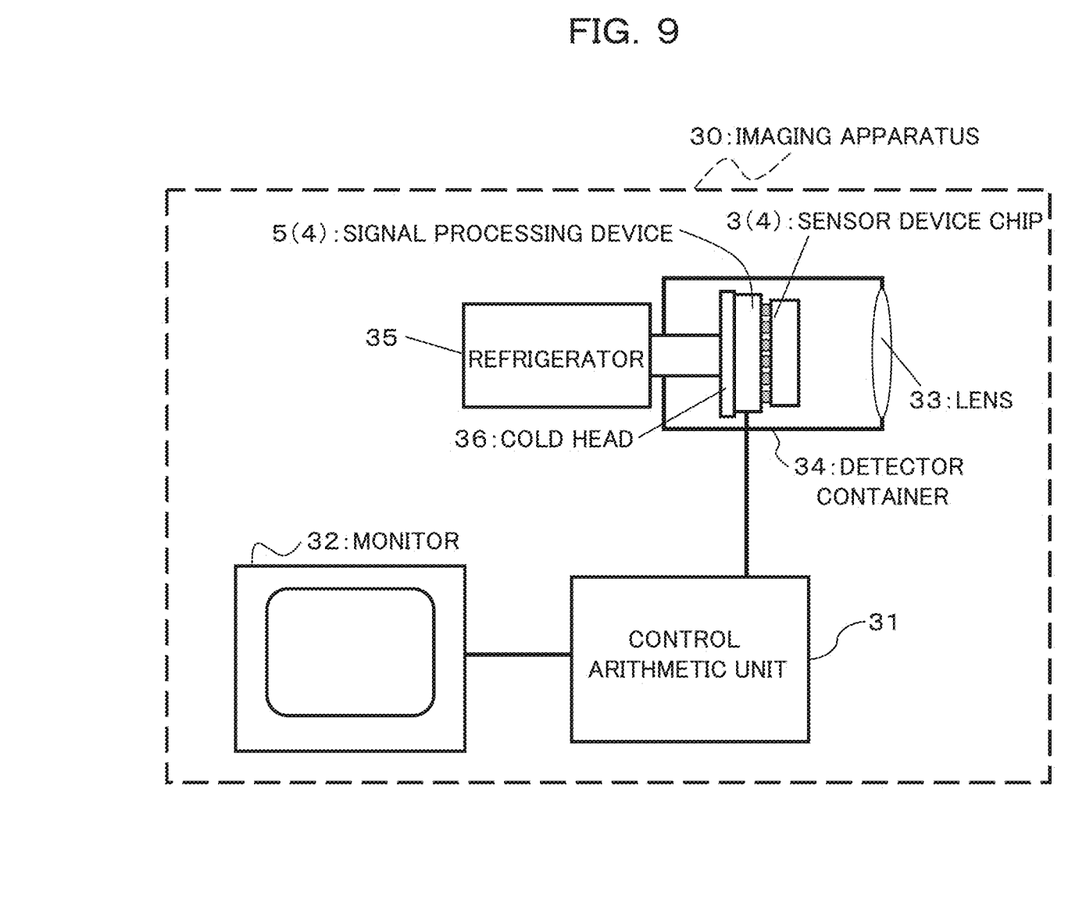
FIG. 9 is a schematic view depicting an example of a configuration of an imaging apparatus according to the present embodiment.

For example, as depicted in FIG. 9, an imaging apparatus (infrared imaging apparatus) 30 may include an optical detector (infrared detector) 4 configured as a device that includes the infrared sensor device chip 3 and the signal processing device 5 as described above, a control arithmetic unit 31 that performs signal processing and various kinds of control, and a monitor 32 that displays an image obtained by imaging.

Then, the infrared detector 4 configured in such a manner as described above may be provided in a vacuum container (detector container) 34 into which infrared rays enter through a lens 33 such that the infrared detector 4 is attached to and cooled by a cold head 36 coupled to a cooling system (refrigerator) 35.

Further, the control arithmetic unit 31 may be coupled to the signal processing device 5 provided in the infrared detector 4 configured as described above such that an output signal from the signal processing device 5 is sent to and processed by the control arithmetic unit 31.

Further, the control arithmetic unit 31 may be configured from a computer or a controller. Further, the control arithmetic unit 31 may include a drive circuit or a signal processing circuit such that it outputs power, a driving pulse or the like for driving the infrared sensor device chip 3 included in the infrared detector 4 configured in such a manner as described above and performs a process for an output signal from the infrared sensor device chip 3 and then outputs an image signal to the monitor 32.

It is to be noted that the configuration of the imaging apparatus is not limited to this, and the imaging apparatus may include the infrared detector 4 configured in such a manner as described above and a control arithmetic unit coupled to the infrared detector 4.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. An optical detector, comprising:
 a sensor device chip including a substrate and a sensor device that is provided at a front face side of the substrate and detects light entering from a back face side of the substrate;

wherein the sensor device chip has, at the back face side of the substrate, a region in which a refractive index varies so as to increase from a light incident face toward a thicknesswise direction.

2. The optical detector according to claim 1, wherein the region in which the refractive index varies is configured from a stacked film that is provided on the back face of the substrate and in which a plurality of films having refractive indexes different from each other are stacked.

3. The optical detector according to claim 2, wherein the stacked film has irregularities at a boundary portion between the plurality of films.

4. The optical detector according to claim 1, wherein the region in which the refractive index varies is a region at the back face side of the substrate and has a porous structure.

5. The optical detector according to claim 1, wherein the region in which the refractive index varies is a region at the back face side of the substrate and has projections having a pillar shape, a wall shape, a conical shape or a pyramidal shape.

6. The optical detector according to claim 5, wherein the projections are disposed at random.

7. The optical detector according to claim 4, wherein a distance between porosities configuring the porous structure or between the projections is equal to or smaller than one half a wavelength of light to be detected.

8. The optical detector according to claim 1, wherein the substrate is a GaSb substrate, an InSb substrate, a Ge substrate, a Si substrate or an InP substrate; and
the region in which the refractive index varies is a region at the back face side of the substrate and has a self-organizing structure by ion implantation.

9. The optical detector according to claim 1, wherein the substrate is a GaSb substrate, an InSb substrate, a Ge substrate, a Si substrate or an InP substrate; and
the region in which the refractive index varies is a region at the back face side of the substrate and has a composition different from that of a different region of the substrate.

10. The optical detector according to claim 1, wherein the substrate is a GaSb substrate, an InSb substrate, a Ge substrate, a Si substrate or an InP substrate; and
the region in which the refractive index varies is a region at the back face side of the substrate and contains Ga by a greater amount than the other region of the substrate or contains one of elements of Sn, N, Ar, Xe, Kr and Ne.

11. The optical detector according to claim 1, wherein the sensor device detects light of an infrared region of a wavelength from 0.7 μm to 15 μm.

12. An imaging apparatus, comprising:
an optical detector; and
a control arithmetic unit coupled to the optical detector;
wherein the optical detection includes
a sensor device chip including a substrate and a sensor device that is provided at a front face side of the substrate and detects light entering from a back face side of the substrate; and
wherein the sensor device chip has, at the back face side of the substrate, a region in which a refractive index varies so as to increase from a light incident face toward a thicknesswise direction.

* * * * *